US008507968B2

(12) United States Patent
Strukov et al.

(10) Patent No.: US 8,507,968 B2
(45) Date of Patent: Aug. 13, 2013

(54) MEMRISTIVE TRANSISTOR MEMORY

(75) Inventors: Dmitri B. Strukov, Menlo Park, CA (US); Philip J. Kuekes, Menlo Park, CA (US); Duncan Stewart, Ottawa (CA); Zhiyong Li, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 143 days.

(21) Appl. No.: 13/142,581

(22) PCT Filed: Jan. 30, 2009

(86) PCT No.: PCT/US2009/032740
§ 371 (c)(1),
(2), (4) Date: Jun. 28, 2011

(87) PCT Pub. No.: WO2010/087854
PCT Pub. Date: Aug. 5, 2010

(65) Prior Publication Data
US 2011/0266605 A1    Nov. 3, 2011

(51) Int. Cl.
*H01L 29/76*    (2006.01)
*H01L 21/336*    (2006.01)

(52) U.S. Cl.
USPC .......................................... 257/314; 438/288

(58) Field of Classification Search
USPC .......................... 438/288; 257/314, E29.309
See application file for complete search history.

(56) References Cited

U.S. PATENT DOCUMENTS

| 6,107,141 A * | 8/2000 | Hsu et al. ...................... 438/267 |
| 7,763,880 B2 * | 7/2010 | Williams .......................... 257/8 |
| 7,851,307 B2 * | 12/2010 | Ramaswamy et al. ........ 438/258 |
| 2006/0121661 A1 | 6/2006 | Yang et al. |
| 2007/0267689 A1 * | 11/2007 | Basceri et al. ................ 257/324 |
| 2008/0001172 A1 | 1/2008 | Karg et al. |
| 2008/0079029 A1 * | 4/2008 | Williams ...................... 257/213 |
| 2008/0090337 A1 * | 4/2008 | Williams ...................... 438/133 |
| 2011/0176353 A1 * | 7/2011 | Li et al. ......................... 365/148 |
| 2011/0182108 A1 * | 7/2011 | Williams et al. .............. 365/148 |
| 2011/0227022 A1 * | 9/2011 | Cho ................................. 257/3 |
| 2011/0227030 A1 * | 9/2011 | Pickett et al. ..................... 257/4 |
| 2011/0227032 A1 * | 9/2011 | Xia et al. ........................... 257/5 |
| 2011/0228592 A1 * | 9/2011 | Kamins et al. ................ 365/148 |
| 2011/0240941 A1 * | 10/2011 | Pickett et al. ..................... 257/1 |

OTHER PUBLICATIONS

International Search Report (Sep. 29, 2009), Hewlett-Packard Development Company, L.P., PCT Application No. PCT/US2009/032740, filed Jan 30, 2009.

* cited by examiner

*Primary Examiner* — Kevin Parendo

(57) ABSTRACT

A memory device (100) includes a semiconductor wire including a source region (132), a drain region (134), and a channel region (130) between the source region (132) and the drain region (134). A gate structure that overlies the channel region includes a memristive portion (120) and a conductive portion (110) overlying the memristive portion (120).

18 Claims, 2 Drawing Sheets

MEMRISTIVE TRANSISTOR MEMORY

BACKGROUND

Some of the first practical memristive devices are described in U.S. Pat. App. Pub. No. 2008/0090337, entitled "Electrically Actuated Switch," to R. Stanley Williams. These memristive devices utilize the behavior of nanoscale materials, particularly, a thin film of a material such as titanium dioxide between two electrodes. The electrical properties of the thin films in such a device can be drastically changed through currents that move dopants within the thin films. For example, ion currents can move dopants into an intrinsic material converting the material from its intrinsic or non-conductive state to a conductive semiconductor state. The conductivity between two electrodes can thus be switched from a non-conductive OFF state to a conductive ON state. Electric currents can also move dopants out of the thin films returning the device to its non-conductive state. Devices containing such materials can be used to implement compact, non-volatile switches as described in U.S. Pat. App. Pub. No. 2008/0090337, and in particular, such structures can currently be fabricated with feature sizes on the order of about 10 nm.

Memristors have been proposed for use as memory devices, and practical high density memory architectures using memristive devices are desired.

BRIEF DESCRIPTION OF THE DRAWINGS

Use of the same reference symbols in different figures indicates similar or identical items.

DETAILED DESCRIPTION

Non-volatile memory arrays can use memory transistors including memristive structures in their gate insulator. Each memory transistor can have two or more distinguishable data states represented by the threshold voltage of the transistor, and the threshold voltage of a transistor can be changed by changing the conductivity of a portion of the memristive gate structure. In particular, the electrically induced movement of the dopants can change the conductivity of a memristive structure and effectively change the separation of the gate from the channel of the transistor and thereby changes the threshold voltage of the transistor. High density NAND and NOR architectures for the memory arrays can be achieved by stacking the transistors in multiple layers of an integrated structure.

Figure 1A:
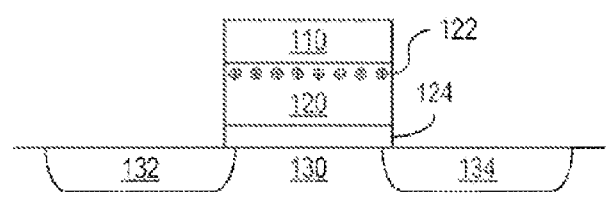
FIGS. 1A and 1B shows cross-sectional views of a non-volatile memory transistor in accordance with an embodiment of the invention including a field-effect transistor with a gate containing a memristive structure respectively in a non-conductive state and a conductive state.
Figure 1B:
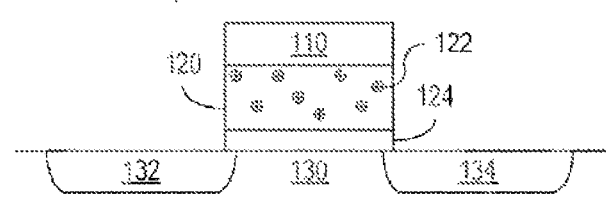

FIGS. 1A and 1B shows a memory transistor 100 respectively in a higher threshold voltage state and a lower threshold voltage state. Memory transistor 100 includes a conductive gate 110, a gate insulator 120, and a semiconductor channel region 130, which is between a source/drain region 132 and a drain/source region 134. Conductive gate 110 can be made of a conductive material such as a metal or highly doped semiconductor. Gate insulator 120 includes a memristive or mobile-dopant structure, embodiments of which are described further below, and regions 130, 132, and 134 are doped regions of a semiconductor material such as silicon with appropriate dopings for channel and source/drain regions of a field effect transistor. In some embodiments described below, regions 130, 132, and 134 are formed in a semiconductor wire (or nanowire) which may have a width of a few tens of nanometers or less.

Memory transistor 100 can operate in the same manner as a convention NMOS or PMOS transistor. For an NMOS transistor, regions 132 and 134 contain n-type semiconductor material, and a sufficient positive gate-drain voltage difference between gate 110 and drain 134 can cause an inversion of the majority charge carries in the p-type material or channel region 130 to create a conductive path between source/drain regions 132 and 134. For a PMOS transistor, regions 132 and 134 contain p-type semiconductor material, and a sufficient negative gate-source voltage can cause an inversion of the majority charge carriers in the n-type material of channel region 130 to create a conductive path between source/drain regions 132 and 134. To illustrate operation of aspects of the invention in specific embodiments, the following description concentrates on embodiments of the invention that are NMOS transistors, but it should be understood that PMOS embodiments of the invention could also be implemented with appropriate changes in materials and applied voltages.

Gate insulator 120 in accordance with an aspect of the current invention includes a material capable of hosting and transporting mobile dopants, and movement of the dopants allows the conductivity of at least a portion of gate insulator 120 to be altered. A memristive gate structure can include a combination of a primary material and a dopant source material. Some examples of material combinations suitable for a memristive gate structure 120 include $TiO_2/TiO_{2-x}$, $ZrO_2/ZrO_{2-x}$, $HfO_2/HfO_{2-x}$, $VO_2/VO_x$, $SrTiO_3/SrTiO_{3-x}$, $GaN/GaN_{1-x}$, $CuCl/CuCl_{1-x}$, and $GaN/GaN:S$, the use of which are described in U.S. Pat. App. Pub. No. 2008/0090337. In an exemplary embodiment, gate insulator 120 includes a thin film (e.g., about 10 nm thick) of intrinsic titanium dioxide ($TiO_2$) with a dopant source region of titanium dioxide having oxygen vacancies (i.e., $TiO_{2-x}$). Intrinsic titanium dioxide is an insulator but becomes a semiconductor when oxygen vacancies are introduced. Further, oxygen vacancies in $TiO_2$ are sufficiently mobile that a practical applied voltage or electric field can move the oxygen vacancies from the $TiO_{2-x}$ layer and change the composition of a thin film $TiO_2$, while applying a lower voltage or a weaker electric field does not significantly move the oxygen vacancies or change the material. Such a $TiO_2/TiO_{2-x}$ structure can be created by depositing intrinsic titanium dioxide ($TiO_2$) and then depositing a layer of titanium (Ti) on the titanium dioxide. A reaction at the Ti—$TiO_2$ interface can create oxygen vacancies in the underlying titanium dioxide layer. Alternatively, the composition of reactants used during deposition or growth of gate insulator 120 can be altered to create a thin layer of dopant source material on top of a primary or intrinsic layer.

FIG. 1A shows a configuration of memory transistor 100 in which dopants 122 (e.g., oxygen vacancies) are in a thin layer at the top of gate insulator 120 so that only the very top of gate insulator 120 is conductive. The configuration of FIG. 1A is a high threshold voltage state of an NMOS memory transistor 100, in which the applied voltage on the gate structure has a relatively large separation from channel 130. In the configuration of FIG. 1A, a gate-drain voltage greater than a threshold voltage V1 is required to make transistor 100 conductive between source/drain regions 132 and 134.

FIG. 1B shows a configuration of memory transistor 100 in which dopants 122 have moved away from conductive gate 110 and toward channel 130. The movement of dopants 122 can be achieved by applying a "programming" voltage Vp to conductive gate 110 while grounding drain/source regions 132 and 134 of memory transistor 110. Programming voltage Vp is greater than threshold voltage V1, so that transistor 100 is turned on and channel 130 will be at substantially the same voltage as regions 132 and 134. The voltage difference between conductive gate 110 and channel 130 is sufficient to create an electric field that moves dopants in gate structure 120. For example, oxygen vacancies are relatively positive in polarity and are pushed away from the positive voltage on conductive gate 110. As a result, conductivity of gate structure 120 will extend further downward toward channel 130 as the dopant ions move toward channel 130. If desired, an optional insulating layer 124 of a material that blocks diffusion of dopant ions or that otherwise remains an insulator (e.g., silicon dioxide) can be positioned above channel 130 to prevent shorting of gate 120 to regions 130, 132, or 134.

The gate structure of transistor 100 in the configuration of FIG. 1B has a conductive portion of the gate closer to channel 130, which provides a lower threshold voltage for an NMOS transistor. The programming process that moves of dopants toward channel 130 can be stopped when the threshold voltage of memory transistor 100 falls below a target voltage V0. This can be achieved by controlling the duration of the applied programming voltage Vp or periodically testing the threshold voltage of transistor 100 after applying a pulse of the programming voltage and stopping the programming pulses when a test indicates the target threshold voltage V0 has been reached.

Transistor 100 can be changed from the low threshold voltage configuration of FIG. 1B to the high threshold voltage configuration of FIG. 1A by applying a positive programming voltage Vp to source/drain regions 132 and 132 while grounding gate 110. The electric field created by that large voltage difference pushes positive polarity dopants away from source/drain regions 132 and 134 and channel region 130. The process for setting memory transistor 100 in the high voltage state can be referred to as an erase process.

Figure 2:
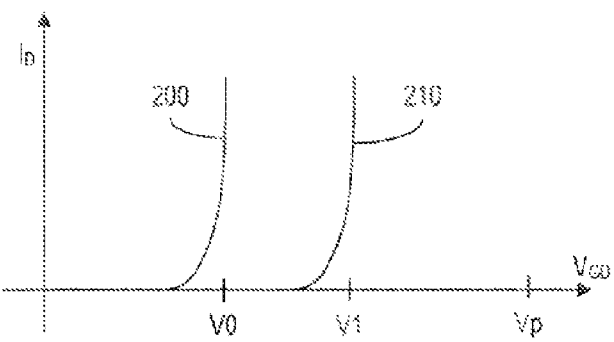
FIG. 2 shows plots of current versus applied gate-drain voltage for the two states of the memory transistor of FIGS. 1A and 1B.

FIG. 2 illustrates current versus voltage plots 200 and 210 for the drain current $I_D$ of memory transistor 100 when a gate-drain voltage $V_{GD}$ is applied. Plot 200 corresponds to the low threshold voltage configuration of FIG. 1B, for which the current through transistor 100 rises sharply when gate-drain voltage $V_{GD}$ rises above threshold voltage V0. Plot 210 corresponds to the high threshold voltage configuration of FIG. 1A, for which the current through transistor 100 doesn't rise significantly until gate-drain voltage $V_{GD}$ rises above threshold voltage V1. The state of transistor 100 can thus be read by applying a gate drain voltage $V_{GD}$ that is greater than or equal to voltage V0 but less than voltage V1 and then sensing whether significant current flows through transistor 100.

FIG. 2 also illustrates the relationship of the threshold voltages V0 and V1 to a programming voltage Vp applied to gate 110 to move dopants in gate structure 120. Voltages V0 and V1 should be lower than programming voltage Vp. In particular, voltages V0 and V1 should be low enough that the threshold voltage of a memory transistor 100 is not significantly disturbed when voltage V0 or V1 is applied to the gate 110 of the memory transistor 100. In general, voltages V0 and V1 depend on the doping in channel 130 of memory transistor 100, the thickness of gate insulator 120, and how far dopants move in gate insulator 120, so in principle, memory transistor 100 could be designed to achieve a wide range of threshold voltages V0 and V1 that are below a specified programming voltage Vp. The programming voltage Vp that is required to move dopants in gate insulator 120 depends on factors such as the specific materials used, the device geometry, and the operating temperature of the device. For example, in a material such as $TiO_2$, ions are more mobile when the local temperature is high, which may be due to Joule heating, i.e., power and device geometry dependant. To provide one specific example, a memory transistor 100 may require a programming voltage Vp of about 5 volts and be designed to have threshold voltages V0 and V1 of about 1 and 2 volts, respectively.

Figure 3:
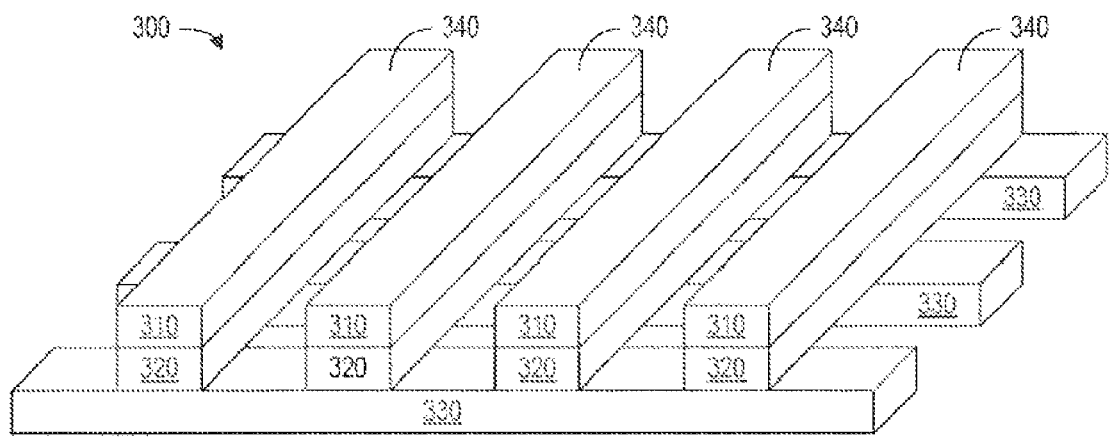
FIG. 3 shows an embodiment of the invention in which an array of memory transistors have source and drain regions formed in semiconductor wires.

Memory transistors 100 can be fabricated in compact arrays that permit programming, erasing, and reading of memory transistors. FIG. 3 illustrates a memory array 300 that is fabricated using a set of gate wires 340 that cross a set of semiconductor wires 330. Each gate wire 340 can include a conductive (e.g., metal) portion 310 overlying a memristive portion 320. Portions 310 and 320 of each gate wire 340 can be substantially identical to conductive gate 110 and gate insulator 120 described above with reference to FIGS. 1A and 1B. Memory array 300 can be fabricated by depositing a layer of semiconductor material such as silicon or gallium arsenide and patterning the layer using either imprint technology or conventional photolithographic techniques to form semiconductor wires 330. Semiconductor wires 330 may have a width and thickness on the order of about 20 nm or less. Regions between semiconductor wires 330 can then be filled with an insulator such as silicon dioxide or silicon nitride and the structure can be planarized if desired by chemical mechanical polishing (CMP) or other suitable technique.

Layers of the materials used in gate wires 340 are then deposited on the structure including semiconductor wires 330. For example, an optional gate insulator layer of silicon nitride or silicon dioxide about 2 nm thick can be deposited on the structure including semiconductor wires 330. A layer of the primary material (e.g. $TiO_2$) about 10 nm thick is deposited on the gate insulator layer. A layer of the dopant source material is created on the primary material, for example, by depositing a layer of titanium about 5 nm or less thick when the primary material is $TiO_2$. A further deposition of contact metal such as platinum or copper can be deposited on the memristive layers. The gate layers can then be patterned using an imprint mask or conventional photolithographic processes to form gate wires 340 and expose portions of semiconductor wires 330 as shown in FIG. 3.

Gate wires 340 can then act as a mask or part of a mask for a self-aligned ion implant process that forms source and drain regions in semiconductor wires 330. As a result, a memory transistor of the type described above with reference to FIGS. 1A and 1B is formed in array 300 at each intersection of a semiconductor wire 330 and a gate wire 340. Peripheral circuitry (not shown) for decoding address signals and applying bias voltages to gate wires 340 and semiconductor wires 330 for reading, programming, and erasing memory transistors can be fabricated in a monolithic integrated structure around array 300.

Memory array 300 has a NAND memory array architecture. NAND memory array architectures are known of non-volatile memory such as flash memories using arrays of floating gate or split gate transistors. Peripheral circuits and reading, programming, and erase techniques, which are currently employed in current NAND memories, could be adapted for use with memory array 300.

The state of a selected memory transistor in array 300 can be read by applying a read voltage that is greater than or equal to the low threshold voltage V0 but less than the high threshold voltage V1 to the gate wire 340 that crosses the selected memory transistor. All other gate wires 340 can be biased at a voltage greater than or equal to the high threshold voltage V1 but not high enough to cause significant movement of dopants in the memristive structure 320. The semiconductor wire 330 that crosses the selected memory transistor will then be conductive or not conductive depending on whether the selected memory transistor has the low threshold voltage V0 or the high threshold voltage V1 because the biasing of the non-selected gate lines turns on all of the other memory transistors along the selected semiconductor wire 330. The conductivity of the selected semiconductor wire 330 can be sensed using a sense amplifier or other circuitry and sensing techniques that are well known for integrated circuit memories.

A programming operation for a selected memory transistor in array 300 can lower the threshold voltage of the selected memory transistor from the high threshold voltage V1 to the low threshold voltage V0 without changing the threshold voltages of other memory transistors. The programming operation can apply the programming voltage Vp to the gate wire 340 that crosses the selected memory transistor, while all other gate wires 340 are biased at a voltage greater than or equal to the high threshold voltage V1 but not high enough to cause significant movement of dopants in memristive structures 320. The semiconductor wire 330 that crosses the selected memory transistor can then be grounded from one or both sides, while the other semiconductor wires 330 have voltages that are either allowed to float or are positively biased. As a result, a large voltage drop and strong electric field only results on the selected memory transistor and therefore significant dopant currents that lower the threshold voltage are only in the selected memory transistor.

An erase operation in array 300 can raise the threshold voltage of a selected memory transistor or a block of memory transistors from the low threshold voltage V0 to the high threshold voltage V1 without changing the threshold voltages of other memory transistors. For example, an erase operation for a row of memory transistors corresponding to a selected gate wire 340 can apply a negative programming voltage −Vp to the selected gate wire 340, while all other gate wires 340 are biased at a voltage greater than or equal to the high threshold voltage V1 but not high enough to cause significant movement of dopants in the memristive structure. All semiconductor wires 330 can then be grounded from one or both sides. As a result, a large negative voltage drop only results on the memory transistors that the selected gate wire 340 crosses and a row of memory transistors can be simultaneously erased.

Figure 4:
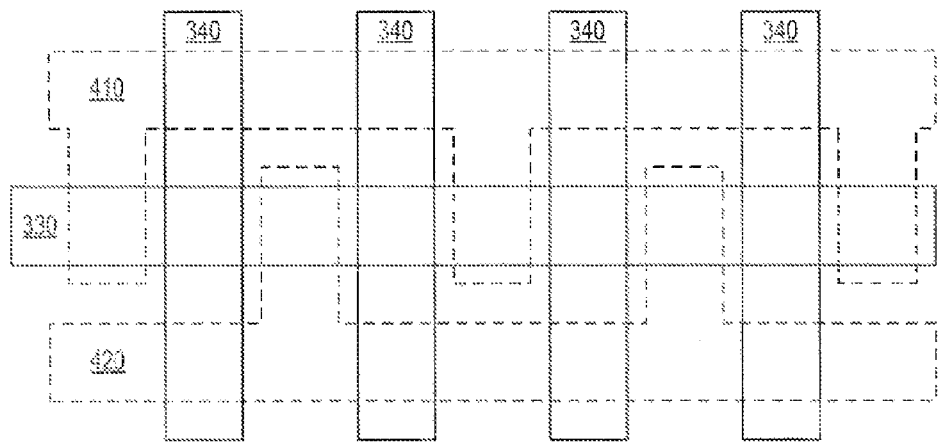
FIG. 4 shows a layout for a NOR array of memory transistors in accordance with an embodiment of the invention.

A NOR memory array can be formed from array 300 by adding source and drain wires that may be formed in additional layers not shown in FIG. 3. FIG. 4, for example, shows a plan view of one of the semiconductor wires 330 of FIG. 3 with crossing gate wires 340. Source/drain regions can be implanted in semiconductor wire 330 in between gate wires 340 as described above. For a NOR array, a drain line 410 for semiconductor wire 330 is electrically connected to every other implanted region in semiconductor wire 330, and a source line 420 is electrically connected to the implanted region in semiconductor wire 330 that are not connected to drain line 410. Lines 410 and 420 can be formed in layers overlying or underlying semiconductor wire 330 and gate wires 340 and may employ contact structures for electrical connections to the implanted source/drain regions in semiconductor wire 330. In an exemplary embodiment, semiconductor wire 330 is formed on underlying lines 410 and 420, and each implanted regions extends all the way through semiconductor wire 330 to make direct electrical contact with corresponding line 410 or 420.

The NOR array permits application of bias voltages to source and drain regions of semiconductor wire 330 through drain and source lines 410 and 420 without turning on all non-selected memory transistors along semiconductor wire 330. Processes and peripheral circuitry for reading, programming, and erasing NOR arrays of floating gate and split gate transistors are known in the art and can be adapted for use in a NOR array employing memory transistors as shown in FIG. 4.

Figure 5:
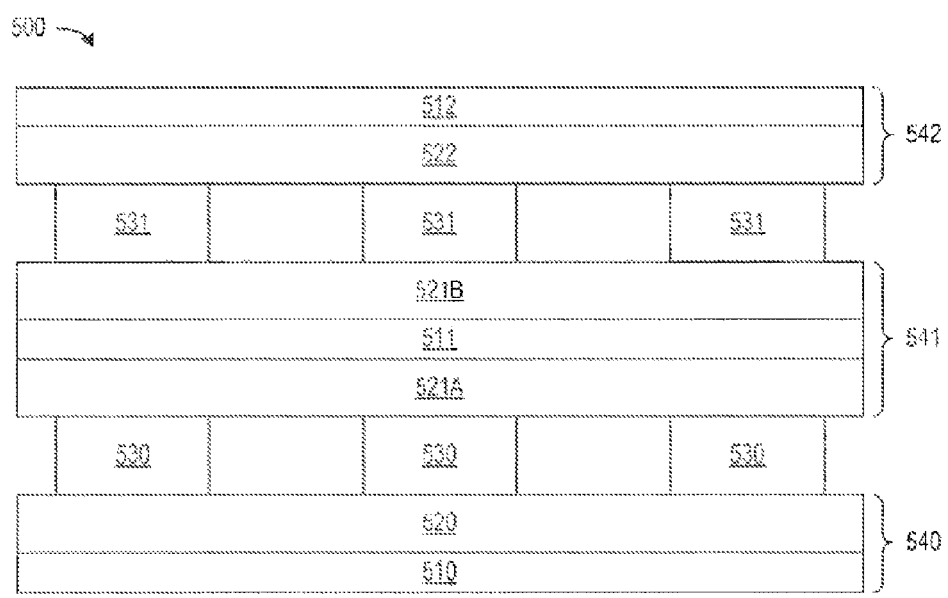
FIG. 5 shows a cross-section of a memory array in accordance with an embodiment of the invention having multiple layers of memory transistors.

An advantage of the NAND and NOR arrays described above is that the fabrication of layers employed including formation of the memristive layers can be performed at relatively low temperatures, which makes integration of multiple stacks of arrays possible. Accordingly, high levels of memory density and integration can be achieved using a three-dimensional structure. FIG. 5 shows a cross-sectional view of a three-dimensional memory array 500 employing multiple arrays of memory transistors in a stack. Memory array 500 includes bottom gate wires 540, each of which has a conductive portion 510 and a memristive portion 520. Semiconductor wires 530 cross bottom gate wires 540. A layer of internal gate wires 541 cross over semiconductor wires 530 and can be used as a mask that controls implanting of source/drain regions in semiconductor wire 530. Each internal gate wire 541 includes a lower memristive portion 521A, a conductive portion 511, and an upper memristive portion 521B. Semiconductor wires 531 cross internal gate wires 541. A top layer of gate wires 542 cross over semiconductor wires 531, and each of gate wires 542 includes a memristive portion 522 and a conductive portion 512. In general, conductive gate portions 510, 511, and 512 can be substantially identical to conductive gate portions 310 of FIG. 3, and memristive gate portions 520, 521A, 521B, and 522 can be substantially identical to gate insulator portions 320 of FIG. 3.

Memory array 500 in the illustrated embodiment includes four layers of storage locations. A first layer of storage location can be accessed using gate wires 540 and semiconductor wires 530 and corresponds to regions in memristive gate portions 520 at intersections of gate wires 540 and semiconductor wires 530. A second layer of storage location can be accessed using gate wires 541 and semiconductor wires 530 and corresponds to regions in memristive gate portions 521A at intersections of gate wires 541 and semiconductor wires 530. A third layer of storage location can be accessed using gate wires 541 and semiconductor wires 531 and corresponds to regions in memristive gate portions 521B at intersections of gate wires 541 and semiconductor wires 531. A fourth layer of storage location can be accessed using gate wires 542 and semiconductor wires 531 and corresponds to regions in memristive gate portions 522 at intersections of gate wires 542 and semiconductor wires 531. Storage locations in each layer can be accessed using the appropriate gate and semiconductor wires and the processes for reading, programming, and erasing memory transistors described above. Additional layers of storage can be added to memory array 500 by adding additional layers of semiconductor wires and gate wires following the pattern illustrated in FIG. 5.

Although the invention has been described with reference to particular embodiments, the description is only an example of the invention's application and should not be taken as a limitation. For example, memory transistors having threshold voltages that define binary states are described, but such memory transistors could have any number of discrete or continuous threshold voltage levels to store multi-bit or continuous data in each memory transistor. Various other adaptations and combinations of features of the embodiments disclosed are within the scope of the invention as defined by the following claims.

What is claimed is:

1. A memory device comprising:
   a semiconductor including a source region, a drain region, and a channel region between the source region and the drain region;
   a first gate structure overlying the channel region, wherein the first gate structure comprises:
   a first memristive portion overlying the channel region; and
   a first conductive portion overlying the first memristive portion; and
   a second gate structure underlying the channel region, wherein the second gate structure comprises:
   a second memristive portion underlying the channel region; and
   a second conductive portion underlying the second memristive portion.

2. The device of claim 1, wherein the first memristive portion comprises:
   a primary material capable of transporting and hosting dopants; and
   a source material containing the dopants, the source material being adjacent to the primary material so that dopants from the source material diffuse into the primary material in response to a programming voltage applied across the memristive portion.

3. The device of claim 2, wherein the primary material is selected from a group consisting of $TiO_2$, $ZrO_2$, $HfO_2$, $VO_2$, $SrTiO_3$, GaN, and CuCl.

4. The device of claim 1, wherein the first gate structure further comprises an insulating layer between the first memristive structure and the channel region.

5. The device of claim 4, wherein the second gate structure further comprises an insulating layer between the second memristive structure and the channel region.

6. The memory device of claim 1, wherein the semiconductor comprises a semiconductor wire containing the source region, the drain region, and the channel region.

7. A memory device comprising:
   a first set of gate wires, wherein each of the gate wires comprises a first memristive portion, a conductive portion, and a second memristive portion that is on an opposite side of the conductive portion of the gate wire from the first memristive portion;
   a first set of semiconductor wires that cross the gate wires and are adjacent to the first memristive portions, wherein a channel region resides in the semiconductor wires at each location where the first set of the semiconductor wires cross the gate wires, and source/drain regions are on either side of the channel regions; and
   a second set of semiconductor wires that are adjacent to the second memristive portions of the gate wires.

8. The device of claim 7, wherein each of the first and second memristive portions of each gate wire comprises:
   a primary material capable of transporting and hosting dopants; and
   a source material containing the dopants, the source material being adjacent to the primary material so that dopants from the source material diffuse into the primary material in response to a programming voltage applied across the memristive portion.

9. The device of claim 8, wherein the primary material is selected from a group consisting of $TiO_2$, $ZrO_2$, $HfO_2$, $VO_2$, $SrTiO_3$, GaN, and CuCl.

10. The device of claim 7, further comprising:
    a second set of gate wires that crosses the first set of semiconductor wires on a side of the first set of semiconductor wires opposite from where the first set of gate wires crosses the first set of semiconductor wires, wherein each of the gate wires in the second set comprises a memristive portion and a conductive portion.

11. The device of claim 10, further comprising:
    a third set of gate wires that crosses the second set of semiconductor wires on a side of the second set of semiconductor wires opposite from where the first set of gate wires crosses the second set of semiconductor wires, wherein each of the gate wires in the third set comprises a memristive portion and a conductive portion.

12. The device of claim 7, further comprising drain lines that respectively correspond to the semiconductor wires, wherein for each of the channel regions in each of the semiconductor wires, the drain line corresponding to the semiconductor wire is electrically connected to one of the source/drain regions adjacent to the channel region.

13. The device of claim 7, further comprising:
    a first set of insulating regions between the gate wires and the first semiconductor wires; and
    a second set of insulating regions between the gate wires and the second semiconductor wires.

14. A process for fabricating a memory device comprising:
    forming a first plurality of semiconductor wires;
    forming over the semiconductor wires a first layer of a first material capable of transporting and hosting dopants;
    creating a second layer containing dopants that are able to flow into the first layer in response to an applied electric field;
    forming a conductive layer on the second layer;
    creating a third layer containing the dopants, the third layer being on the conductive layer; and
    forming a fourth layer of the first material on the third layer;
    patterning the first layer, the second layer, the conductive layer, the third layer, and the fourth layer to form a first plurality of gate wires that cross the first plurality of semiconductor wires; and
    doping source/drain regions in the first plurality of semiconductor wires using the gate wires to mask the implanting; and
    forming a second plurality of semiconductor wires crossing over the first plurality of gate wires.

15. The process of claim 14, where in the first material is selected from a group consisting of $TiO_2$, $ZrO_2$, $HfO_2$, $VO_2$, $SrTiO_3$, GaN, and CuCl.

16. The process of claim 14, further comprising:
    forming over the second plurality of the semiconductor wires a fifth layer of the first material;
    creating a sixth layer containing the dopants;
    forming a second conductive layer on the sixth layer;
    patterning the fifth layer, the sixth layer, and the second conductive layer to form a second plurality of gate wires that cross the second set of semiconductor wires; and
    doping source/drain regions in the second plurality of semiconductor wires using the second plurality of gate wires to mask the implanting.

17. The process of claim 14, forming drain lines that respectively correspond to the semiconductor wires, wherein each of the drain lines is electrically connected to every other of the source/drain regions in the corresponding semiconductor wire.

18. The process of claim 14, wherein the first plurality of semiconductor wires is formed over a third plurality of gate wires.

* * * * *

UNITED STATES PATENT AND TRADEMARK OFFICE
CERTIFICATE OF CORRECTION

PATENT NO. : 8,507,968 B2
APPLICATION NO. : 13/142581
DATED : August 13, 2013
INVENTOR(S) : Dmitri B. Strukov et al.

Page 1 of 1

It is certified that error appears in the above-identified patent and that said Letters Patent is hereby corrected as shown below:

In the Claims

In column 8, line 52, in Claim 15, delete "where in" and insert -- wherein --, therefor.

Signed and Sealed this
Twenty-fourth Day of December, 2013

Margaret A. Focarino
*Commissioner for Patents of the United States Patent and Trademark Office*